US011059986B2

(12) United States Patent
Hasegawa et al.

(10) Patent No.: US 11,059,986 B2
(45) Date of Patent: Jul. 13, 2021

(54) COMPOSITION COMPRISING A NANOSIZED LIGHT EMITTING MATERIAL

(71) Applicant: MERCK PATENT GMBH, Darmstadt (DE)

(72) Inventors: Masaki Hasegawa, Kanagawa (JP); Noriyuki Matsuda, Frankfurt am Main (DE)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 16/464,112

(22) PCT Filed: Nov. 27, 2017

(86) PCT No.: PCT/EP2017/080483
§ 371 (c)(1),
(2) Date: May 24, 2019

(87) PCT Pub. No.: WO2018/096135
PCT Pub. Date: May 31, 2018

(65) Prior Publication Data
US 2019/0375957 A1 Dec. 12, 2019

(30) Foreign Application Priority Data

Nov. 28, 2016 (EP) ..................... 16200961

(51) Int. Cl.
*C09D 11/50* (2014.01)
*C09D 11/033* (2014.01)
(Continued)

(52) U.S. Cl.
CPC ............ *C09D 11/50* (2013.01); *C09D 11/033* (2013.01); *C09D 11/037* (2013.01);
(Continued)

(58) Field of Classification Search
CPC ..... C09D 11/50; C09D 11/033; C09D 11/037; C09D 11/108; C09D 11/30; C09D 5/00; H01L 33/06; H01L 33/005
See application file for complete search history.

(56) References Cited

U.S. PATENT DOCUMENTS 8,765,014 B2   7/2014  Cho et al.
2008/0100199 A1*  5/2008  Sekine ................ C08L 101/005
                                                             313/498
(Continued)

FOREIGN PATENT DOCUMENTS

WO        9518161 A1    7/1995
WO       16134820 A1    9/2016

OTHER PUBLICATIONS

International Search Report PCT/EP2017/080483 dated Jan. 5, 2018 (pp. 1-2).
(Continued)

*Primary Examiner* — Julia Slutsker
(74) *Attorney, Agent, or Firm* — Millen White Zelano and Branigan, PC; John Sopp

(57) ABSTRACT

The present invention relates to a composition comprising a nanosized light emitting material, and method for preparing of said composition. The present invention further relates to a light luminescent medium, a light emitting device, the present invention further more relates to method for preparing of a composition and to method for preparing of a light emitting medium.

12 Claims, 1 Drawing Sheet

(51) Int. Cl.
*C09D 11/037* (2014.01)
*C09D 11/108* (2014.01)
*C09D 11/322* (2014.01)
*C09D 11/36* (2014.01)
*H01L 33/00* (2010.01)
*H01L 33/06* (2010.01)

(52) U.S. Cl.
CPC .......... *C09D 11/108* (2013.01); *C09D 11/322* (2013.01); *C09D 11/36* (2013.01); *H01L 33/005* (2013.01); *H01L 33/06* (2013.01)

(56) References Cited

U.S. PATENT DOCUMENTS

| | | | |
|---|---|---|---|
| 2008/0277626 A1* | 11/2008 | Yang | C09D 11/50 252/301.36 |
| 2009/0294742 A1 | 12/2009 | Jang et al. | |
| 2014/0288205 A1* | 9/2014 | Sato | C09D 11/101 522/81 |
| 2015/0359105 A1* | 12/2015 | Yoon | C09D 7/65 174/268 |
| 2016/0027963 A1* | 1/2016 | Jun | G02B 5/3025 257/13 |
| 2016/0149091 A1 | 5/2016 | Kondo | |
| 2018/0046080 A1 | 2/2018 | Suzuki et al. | |

OTHER PUBLICATIONS

Office action in corresponding Chinese Application No. 201780072714.5 dated Jan. 4, 2021 (pp. 1-8) and english translation therof (pp. 1-8).

\* cited by examiner

COMPOSITION COMPRISING A NANOSIZED LIGHT EMITTING MATERIAL

FIELD OF THE INVENTION

The present invention relates to a composition comprising a nanosized light emitting material, and method for preparing of said composition. The present invention further relates to a light luminescent medium, a light emitting device, the present invention further more relates to method for preparing of a composition and to method for preparing of a light luminescent medium.

BACKGROUND ART

Composition comprising a nanosized light emitting material is known in the prior art.

For example, as described in US 2008/0277626 A1, U.S. Pat. No. 8,765,014 B2

Patent Literature

1. US 2008/0277626 A1
2. U.S. Pat. No. 8,765,014 B2

Non Patent Literature

None

SUMMARY OF THE INVENTION

However, the inventors newly have found that there is still one or more of considerable problems for which improvement is desired as listed below.
1. Novel composition comprising a nanosized light emitting material and a matrix material which provides improved homogeneous light luminescent layer or light luminescent pattern after drying of said composition, is desired.
2. Novel composition comprising a nanosized light emitting material and a matrix material which can prevent or reduce phenomena of moving nanosized light emitting material to the edge of printed pattern when printing and drying of said composition, is required.
3. Novel composition comprising a nanosized light emitting material and a matrix material, which enables smooth printing, is also desired.
4. Novel composition comprising a nanosized light emitting material and a matrix material, which enables better dispersibility of said nanosized light emitting material in said composition, is still a need for improvement.
5. Simple fabrication process for making light luminescent pattern including matrix material and a nanosized light emitting material, is required.

The inventors aimed to solve one or more of the problems indicated above 1 to 5.

Surprisingly, the inventors have found a novel composition comprising, essentially consisting of, or consisting of at least a $1^{st}$ organic solvent having a boiling point 150° C. or more, a matrix material, and a nanosized light emitting material, wherein the matrix material is a polymer, preferably the polymer is a transparent polymer, solves one or more of the above mentioned problems 1 to 5. Preferably, said mixture solves all the problems 1 to 5 at the same time.

In another aspect, the invention also relates to method for preparing of the composition, wherein the method comprising at least following step (a),
 (a) mixing a $1^{st}$ organic solvent having a boiling point 150° C. or more, a matrix material, and a nanosized light emitting material, wherein the matrix material is a polymer, preferably the polymer is a transparent polymer.

In another aspect, the invention further relates to method for preparing of the light emitting medium, wherein the method comprises at least following steps (A) and (B) in this sequence,
 (A) providing the composition according to one or more of claims 1 to 10, onto a substrate,
 (B) removing the $1^{st}$ organic solvent from the composition In another aspect, the invention relates to a light emitting medium comprising at least a transparent substrate including an array of pixels filled with a transparent polymer, and a nanosized light emitting material, which is obtainable from the method for preparing of the light emitting medium.

In another aspect, the invention further relates to an optical device comprising the optical medium.

Further advantages of the present invention will become evident from the following detailed description.

DETAILED DESCRIPTION OF THE INVENTION

Figure 2:
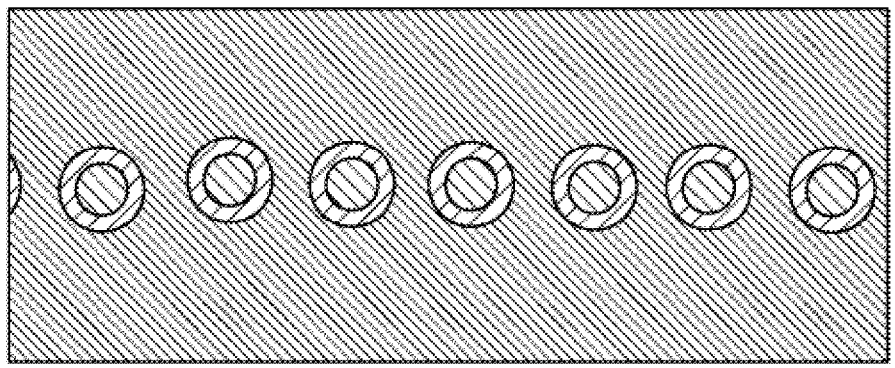
FIG. 2: shows the dried pattern of printed composition 3.

According to the present invention, said composition comprising, essentially consisting of, or consisting of at least a $1^{st}$ organic solvent having a boiling point 150° C. or more, a matrix material, and a nanosized light emitting material, wherein the matrix material is a polymer, preferably the polymer is a transparent polymer.

According to the present invention, the boiling points of solvents is measured with Dosa Therm 300® from Titan Technologies.

In some embodiments of the present invention, the absolute viscosity of the composition can be in the range from 1 mPa·s to 20 mPa·s.

The viscosity of the compositions and solvents according to the present invention is measured with VM-10A-L® from SEKONIC.

In a preferred embodiment of the present invention, the composition comprises a plurality of nanosized light emitting materials.

In a preferred embodiment of the present invention, it is in the range from 3 mPa·s to 15 mPa·s. to realize a better printing.

In some embodiments of the present invention, the liquid surface tension of the composition can be in the range from 10 mN/m to 60 mN/m.

According to the present invention, the surface tension measurements can be performed with Pendant Drop method with using DM-501® from Kyowa Interface Science Co., Ltd.

In a preferred embodiment of the present invention, the liquid surface tension of the composition is in the range from 20 mN/m to 50 mN/m.

Nanosized Light Emitting Material

According to the present invention, as a nanosized light emitting material, a wide variety of publically known nanosized light emitting material can be used as desired.

A type of shape of the nanosized light emitting material of the present invention is not particularly limited.

Any type of nanosized light emitting material, for examples, spherical shaped, elongated shaped, star shaped, polyhedron shaped semiconductor nanocrystals, can be used in this way.

According to the present invention, the term "nano" means the size in between 1 nm and 999 nm.

Thus, according to the present invention, the term "nanosized light emitting material" is taken to mean that a light emitting material which size of the overall diameter is in the range from 1 nm to 999 nm. And in case of the nanosized light emitting material has non spherical shape, such as an elongated shape, the length of the overall structures of the nanosized light emitting material is in the range from 1 nm to 999 nm.

According to the present invention, the term "quantum sized" means the size of the semiconducting material itself without ligands or another surface modification, which can show the quantum confinement effect, like described in, for example, ISBN: 978-3-662-44822-9.

Generally quantum sized materials, such as quantum dot materials and quantum rod materials, can emit tunable, sharp and vivid colored light due to "quantum confinement" effect.

Therefore, in a preferred embodiment of the present invention, the nanosized light emitting material is a quantum sized material.

In a preferred embodiment of the invention, the length of the overall structures of the quantum sized material is in the range from 1 nm to 100 nm. More preferably, it is from 2 nm to 20 nm, even more preferably, it is in the range from 3 nm to 10 nm.

In a preferred embodiment of the present invention, the nanosized light emitting material comprises II-VI, III-V, IV-VI semiconductors and combinations of any of these.

In case of the nanosized light emitting material does not have any core/shell structure, the semiconductor nanocrystal can preferably be selected from the group consisting of InP, CdS, CdSe, CdTe, ZnS, ZnSe, ZnSeS, ZnTe, ZnO, InPZnS, InPZn, $Cu_2(ZnSn)S_4$.

In a preferred embodiment of the present invention, the nanosized light emitting material comprise a core/shell structure.

According to the present invention, the term "core/shell structure" means the structure having a core part and at least one shell part covering said core.

In some embodiments of the present invention, said core/shell structure can be core/one shell layer structure, core/double shells structure or core/multishells structure.

According to the present invention, the term "multishells" stands for the stacked shell layers consisting of three or more shell layers.

Each stacked shell layers of double shells and/or multishells can be made from same or different materials.

More preferably, a core of the nanosized light emitting material (120) is selected from the group consisting of Cds, CdSe, CdTe, ZnS, ZnSe, ZnSeS, ZnTe, ZnO, GaAs, GaP, GaAs, GaSb, HgS, HgSe, HgSe, HgTe, InAs, InP, InPZnS, InPZn, InSb, AlAs, AlP, AlSb, $Cu_2S$, $Cu_2Se$, CuInS2, $CuInSe_2$, $Cu_2(ZnSn)S_4$, $Cu_2(InGa)S_4$, $TiO_2$ alloys and combination of any of these.

In a preferred embodiment of the present invention, said shell is selected from the group consisting of II-VI, III-V, or IV-VI semiconductors.

For example, for red emission use CdSe/CdS, CdSeS/CdZnS, CdSeS/CdS/ZnS, ZnSe/CdS, CdSe/ZnS, InP/ZnS, InP/ZnSe, InP/ZnSe/ZnS, InPZn/ZnS, InPZn/ZnSe/ZnS dots or rods, ZnSe/CdS, ZnSe/ZnS or combination of any of these, can be used preferably.

For example, for green emission use CdSe/CdS, CdSeS/CdZnS, CdSeS/CdS/ZnS, ZnSe/CdS, CdSe/ZnS, InP/ZnS, InP/ZnSe, InP/ZnSe/ZnS, InPZn/ZnS, InPZn/ZnSe/ZnS, ZnSe/CdS, ZnSe/ZnS or combination of any of these can be used preferably.

And for blue emission use, such as ZnSe, ZnS, ZnSe/ZnS, or combination of any of these, can be used.

As a quantum dot, publically available quantum dot, for examples, CdSeS/ZnS alloyed quantum dots product number 753793, 753777, 753785, 753807, 753750, 753742, 753769, 753866, InP/ZnS quantum dots product number 776769, 776750, 776793, 776777, 776785, PbS core-type quantum dots product number 747017, 747025, 747076, 747084, or CdSe/ZnS alloyed quantum dots product number 754226, 748021, 694592, 694657, 694649, 694630, 694622 from Sigma-Aldrich, can be used preferably as desired.

In some embodiments, the semiconductor nanocrystal can be selected from an anisotropic shaped structure, for example quantum rod material to realize better out-coupling effect (for example *ACS Nano*, 2016, 10 (6), pp 5769-5781). Examples of quantum rod material have been described in, for example, the international patent application laid-open No. WO2010/095140A, Luigi Carbone et. al, Nanoletters, 2007, Vol. 7, No. 10, 2942-2950.

In a preferred embodiment of the present invention, the semiconductor nanocrystal additionally comprises a surface ligand.

The surface of the semiconductor nanocrystal can be over coated with one or more kinds of surface ligands.

Without wishing to be bound by theory it is believed that such surface ligands may lead to disperse the semiconductor nanocrystal in a solvent more easily.

The surface ligands in common use include phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), Octadecylphosphonic acid (ODPA), and Hexylphosphonic acid (HPA); amines such as Dedecyl amine (DDA), Tetradecyl amine (TDA), Hexadecyl amine (HDA), and Octadecyl amine (ODA), thiols such as hexadecane thiol and hexane thiol; mercapto carboxylic acids such as mercapto propionic acid and mercaptoundecanoic acid; and a combination of any of these.

Examples of surface ligands have been described in, for example, the international patent application laid-open No. WO 2012/059931A.

$1^{st}$ Organic Solvent

According to the present invention, as said $1^{st}$ organic solvent, any type of organic solvent having boiling point 150° C. or more under atmospheric pressure can be used alone or as a mixture.

More preferably, said $1^{st}$ organic solvent is an organic solvent having boiling point in the range from 150° C. to 410° C. under atmospheric pressure with being even more preferably in the range from 200° C. to 330° C. under atmospheric pressure to realize better viscosity of the composition and the liquid surface tension of the composition in addition to better solubility or better dispersity of the matrix material/nanosized light emitting material.

In a preferred embodiment of the present invention, the 1$^{st}$ organic solvent is selected from one or more members of the group consisting of alkyl chains having 9-25 carbon atoms, and alkenyl chains having 10-25 carbon atoms, ethylene glycol, triethylene glycol, glycerin, acetamide, dimethyl acetamide, dimethyl sulfoxide, trimethyl benzenes such as 1,3,5-trimethylbenzene, 1,2,4-trimethyl benzene, 1,2,3-trimethyl benzene, docecylbenzene, cyclohexylbenzene, 1,2,3,4-tetramethylbenzene, 1,2,3,5-tetramethylbenzene, 3-isopropylbiphenyl, 3-methylbiphenyl, 4-methylbiphenyl, p-anysyl alcohol, 1-methylnaphthalene, 1,2,3,4-tetrahydronaphthalene, hexyl alcohols, octanols, lauryl alcohols and their derivatives.

According to the present invention, the alkyl chain, or the alkenyl chain can be straight chain or branched chain, with preferably being of straight chain.

In some embodiments of the present invention, an alkyl chain having 9 to 25 carbon atoms or an alkenyl chain having 10 to 25 carbon atoms can be unsubstituted, mono- or polysubstituted by halogen or CN, it being also possible for one or more non-adjacent $CH_2$ groups to be replaced, in each occurrence independently from one another, by —O—, —S—, —NH—, —N($CH_3$)—, —CO—, —COO—, —OCO—, —O—CO—O—, —S—CO—, —CO—S—, —CH═CH—, —CH═CF—, —CF═CF— or —C≡C— in such a manner that oxygen atoms are not linked directly to one another.

In a preferred embodiment of the present invention, said alkyl chains having 9-25 carbon atoms, and alkenyl chains having 10-25 carbon atoms are unsubstituted.

In a more preferred embodiment of the present invention, said alkyl chain having 9-25 carbon atoms is Nonan (boiling point of 151° C.), Decan (boiling point of 174° C.), Undecan (boiling point of 196° C.), Dodecan (boiling point of 216° C.), Tridecan (boiling point of 235° C.), Tetradecan (boiling point of 254° C.), Pentadecan (boiling point of 270° C.), Hexadecan (boiling point of 287° C.), Heptadecan (boiling point of 302° C.), Octadecan (boiling point of 316° C.), Nonadecan (boiling point of 330° C.), Eicosan (boiling point of 343° C.), Heneicosan (boiling point of 357° C.), Docosan (boiling point of 369° C.), Tricosan (boiling point of 380° C.), Tetracosan (boiling point of 391° C.), or Pentacosan (boiling point of 402° C.), and said alkenyl chain having 10-25 carbon atoms is 1-decene (boiling point of 171° C.), 1-undecene, 1-dodecene, 1-tridecene, 1-tetradecene, 1-pentadecene, 1-hexadecene, 1-heptadecene, 1-octadecene, 1-nonadecene, 1-eicocene, 1-heneicosene, 1-docoene, 1-tricocene, 1-tetracocene, or 1-pentacocene.

In a preferred embodiment of the present invention, the 1$^{st}$ organic solvent is selected from one or more of alkyl chains having 10 to 25 carbon atoms and/or alkenyl chains having 11 to 25 carbon atoms.

More preferably, the 1$^{st}$ organic solvent is selected from one or more of alkyl chains having 12-19 carbon atoms, and/or alkenyl chains having 12-19 carbon atoms.

Even more preferably, the 1$^{st}$ organic solvent is selected from one or more members of the group consisting of tridecan, tetradecane, pentadecane, hexadecane, heptadecan, and octadecane.

Without wishing to be bound by theory, it is believed that the 1$^{st}$ organic solvent mentioned above prevents or reduces a convection of the composition due to lower volatilization speed driven from a high boiling point of the 1$^{st}$ organic solvent itself, when solvents in the composition are drying up from the composition.

According to the present invention, for example, propylene glycol monomethyl ether acetate (PGMEA: boiling point 145° C.) is not sufficient as the 1$^{st}$ organic solvent since it has higher volatilization speed.

In other words, without wishing to be bound by theory, it is believed that such high boiling point of the 1$^{st}$ organic solvent gives smaller evaporation rate of said solvent when drying the printed composition and it prevents or reduces convection of the composition.

Matrix Material

According to the present invention, as a matrix material, a wide variety of publically known one or more of polymers can be used preferably.

Especially, transparent polymers suitable for optical mediums such as optical devices can be used more preferably as the polymer.

According to the present invention, the term "transparent" means at least around 60% of incident light transmit at the thickness used in an optical medium and at a wavelength or a range of wavelength used during operation of an optical medium. Preferably, it is over 70%, more preferably, over 75%, the most preferably, it is over 80%.

According to the present invention the term "polymer" means a material having a repeating unit and having the weight average molecular weight (Mw) 1000 or more.

In a preferred embodiment of the present invention, the weight average molecular weight (Mw) of the polymer is in the range from 10,000 to 150,000.

More preferably it is in the range from 15,000 to 100,000 to give suitable viscosity to said composition and to give suitable strength of matrix material after fabrication.

Without wishing to be bound by theory, it is believed that the polymer of the matrix material having the weight average molecular weight (Mw) in the range mentioned above prevents or reduces a convection of composition when solvents in the composition are drying up from the composition.

Without wishing to be bound by theory, it is believed that the combination of 1$^{st}$ organic solvent having a boiling point 150° C. or more, and the polymer is highly effective to prevent or reduce a convection of composition when solvents in the composition are drying up from the composition and to prevent phenomena of moving nanosized light emitting material to the edge of printed pattern.

According to the present invention, the molecular weight $M_w$ can be determined by means of GPC (=gel permeation chromatography) against an internal polystyrene standard.

As a polymer, in some embodiments, one or more of electrically conductive polymers can be used.

In a preferred embodiment of the present invention the transparent polymer is selected from one or more members of the group consisting of cyclo olefine copolymers, polyvinyl alcohols, polyacrylonitriles, and ethylene vinyl alcohols from the viewpoints of better viscosity of the transparent polymers, better optical transparency, lower moisture absorption, lower oxygen absorption, and lower birefringence properties.

More preferably, the transparent polymer is a cyclo olefin copolymer from the view point of better viscosity controlling, better optical transparency, lower moisture absorption, lower oxygen absorption, and lower birefringence properties.

If case of the transparent polymer is a cyclo olefin copolymer, the 1$^{st}$ organic solvent can be selected from one or more of alkyl chains having 10 to 25 carbon atoms and/or alkenyl chains having 11 to 25 carbon atoms more preferably.

In case of the transparent polymer is one selected from one or more of members of the group consisting of polyvinyl alcohols, polyacrylonitriles, and ethylene vinyl alcohols, then, the $1^{st}$ organic solvent can be selected from one or more of the group consisting of ethylene glycol, triethylene glycol, glycerin, acetamide, dimethyl acetamide, dimethyl sulfoxide more preferably.

$2^{nd}$ Organic Solvent

According to the present invention, in some embodiments, the composition can further comprise $2^{nd}$ organic solvent having a boiling point in the range from 30° C. to 400° C.

For example, said $2^{nd}$ organic solvent can be selected from the group consisting of purified/deionized water; ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, and glycerin; esters, such as, ethyl 3-ethoxypropionate, methyl 3-methoxypropionate and ethyl lactate; and cyclic asters, such as, γ-butyro-lactone; chlorinated hydrocarbons, such as chloroform, dichloromethane, chlorobenzene, dichlorobenzene, trimethyl benzenes such as 1,3,5-trimethylbenzene, 1,2,4-trimethyl benzene, 1,2,3-trimethyl benzene, docecylbenzene, cyclohexylbenzene, 1,2,3,4-tetramethylbenzene, and 1,2,3,5-tetramethylbenzene.

Those solvents can be used singly or in combination of two or more if applicable.

In a preferred embodiment of the present invention, the boiling point of the $2^{nd}$ organic solvent is in the range from 150° C. to 330° C.

More preferably, the $2^{nd}$ organic solvent is selected from one or more members of the group consisting of, trimethyl benzenes such as 1,3,5-trimethylbenzene, 1,2,4-trimethyl benzene, 1,2,3-trimethyl benzene, docecylbenzene, cyclohexylbenzene, 1,2,3,4-tetramethylbenzene, and 1,2,3,5-tetramethylbenzene to disperse said nanosized light emitting material into said composition well and to more precisely control the absolute viscosity of the composition and the liquid surface tension of the composition.

According to the present invention, said $2^{nd}$ organic solvent is different from said $1^{st}$ organic solvent.

Another Additives

In some embodiments of the present invention, optionally, the composition can further comprise one or more of another light luminescent materials selected from one or more members of the group consisting of organic light luminescent materials, host matrix materials, electron transporting materials, and an inorganic light luminescent materials.

As organic light luminescent materials, any kinds of organic fluorescent dyes and/or organic phosphorescent dyes can be used as desired. Such as commercially available laser dyes and/or light emissive dyes used in an organic light emissive diode. For examples, Laser dyes from Indeco Corporation, dyes from American Dye Sources.

In a preferred embodiment of the present invention, as organic light luminescent materials for blue emission use, laser dyes from Indeco Corporation such as Coumarin 460, Coumarin 480, Coumarin 481, Coumarin 485, Coumarin 487, Coumarin 490, LD 489, LD 490, Coumarin 500, Coumarin 503, Coumarin 504, Coumarin 504T, Coumarin 515; commercially available luminescent dyes such as Perylene, 9-amino-acridine, 12(9-anthroyoxy)stearic acid, 4-phenylspyro[furan-2(3H), 1'-futalan]-3,3'-dione, N-(7-dimethylamino-4-methylcoumarynyl)maleimide; dyes from American Dye Sources such as ADS135BE, ADS040BE, ADS256FS, ADS086BE, ADS084BE; or a combination of any of these, can be used.

As an organic light luminescent materials for green emission use, laser dyes from Indeco Corporation such as Coumarin 522/522B, Coumarin 525 or a combination of any of these can be used preferably.

As an organic light luminescent materials for red emission use, laser dyes from Indeco Corporation such as DCM, Fluorol 555, Rhodamine 560 Perchlorate, Rhodamine 560 Chloride, LDS 698; dyes from American Dye Source Inc., such as ADS055RE, ADS061 RE, ADS068RE, ADS069RE, ADS076RE or a combination of any of these, can be used in this way preferably.

According to the present invention, in some embodiments, one or more of red organic dyes together with one or more of green light emitting dyes which can convert UV light and/or blue light into green light, can be used for red emission use like described in JP 2003-264081 A.

As inorganic light luminescent materials, any kinds of commercially available inorganic fluorescent materials can be used as desired.

In a preferred embodiment of the invention, inorganic light luminescent materials is present and preferably selected from one or more members of the group consisting of sulfides, thiogallates, nitrides, oxynitrides, silicated, aluminates, apatites, borates, oxides, phosphates, halophosphates, sulfates, tungstenates, tantalates, vanadates, molybdates, niobates, titanates, germinates, halides based phosphors.

Suitable inorganic light luminescent materials described above are well known to the skilled person and mentioned e.g. in the phosphor handbook, $2^{nd}$ edition (CRC Press, 2006), pp. 155-pp. 338 (W. M. Yen, S. Shionoya and H. Yamamoto), WO2011/147517A, and WO2012/034625A.

More preferably, the said inorganic light luminescent materials have a medium size in the range from 1 nm to 100 nm. More particularly preferably, the medium size is in the range from 3 nm to 50 nm. The most preferably, from 5 nm to 25 nm.

For blue inorganic light luminescent materials, Cu activated zinc sulfide phosphors like described in Japanese patent application laid-open no. JP2002-062530 A, Eu activated halophosphate phosphors and/or Eu activated aluminate phosphors like described in JP 2006-299207 A, or a combination of any of these can be used preferably.

For green inorganic light luminescent materials, Ce or Tb activated rare earth element borate phosphors as described in JP 2006-299207 A, beta-sialon green phosphors described in JP 2007-262417 A, and a combination of any of these, can be used preferably.

For red inorganic light luminescent materials, Eu activated lanthanum sulfide phosphors, Eu activated yttrium sulfide phosphors described in JP 2006-299207 A, yellow phosphors which consist of BaS and $Cu^{2+}$ as an emission site described in JP 2007-063365 A, red phosphors which consist of $Ba_2ZnS_3$ and $Mn^{2+}$ described in JP 2007-063366 A, Ce activated garnet phosphors described in JP 3503139 B, red phosphors described in JP 2005-048105 A, Ca alpha-sialon red phosphors described in JP 2006-257353 A, or a combination of any of these, can be used preferably As host matrix materials, electron transporting materials, publically available materials can be used as desired.

In some embodiments of the present invention, the composition can further comprises light scattering particles.

In some embodiments of the present invention, the composition can comprises said light luminescent material and light scattering particles in addition to a nanosized light emitting material.

As light scattering particles, any type of publically known light scattering particles having different refractive index from the matrix material of the composition which includes the said light scattering particles and can give Mie scattering effects, can be used preferably as desired.

For examples, small particles of inorganic oxides such as $SiO_2$, $SnO_2$, CuO, CoO, $Al_2O_3$ $TiO_2$, $Fe_2O_3$, $Y_2O_3$, ZnO, MgO; organic particles such as polymerized polystyrene, polymerized PMMA; or a combination of any of these; can be used preferably.

Preferably, the average particle diameter of the light scattering particles (150) can be in the range from 350 nm to 5 μm.

Without wishing to be bound by theory, it is believed that more than 350 nm average particle diameter may lead to strong forward scattering caused by Mie scattering in a later, even if the refractive index difference between the light scattering particles and the layer matrix is as small as 0.1.

On the other hand, to obtain better layer forming properties by using the light scattering particles (150), maximum average particle diameter is 5 um or less, preferably. More preferably, from 500 nm to 2 μm.

Optical Medium

In another aspect, the present invention further relates to an optical medium comprising at least a transparent substrate including an array of pixels filled with a matrix material, and a nanosized light emitting material, which is obtainable from said method for preparing of a light emitting medium.

The type of matrix material and the nanosized light emitting material are described in the section of "Matrix material" and in the section of "Nanosized light emitting material" above.

In general, transparent substrate can be flexible, semi-rigid or rigid.

Publically known transparent substrate suitable for optical devices can be used as desired.

Preferably, as a transparent substrate, a transparent polymer substrate, glass substrate, thin glass substrate stacked on a transparent polymer film, transparent metal oxides (for example, oxide silicone, oxide aluminum, oxide titanium), is used.

A transparent polymer substrate can be made from polyethylene, ethylene-vinyl acetate copolymer, ethylene-vinyl alcohol copolymer, polypropylene, polystyrene, polymethyl methacrylate, polyvinylchloride, polyvinyl alcohol, polyvinylvutyral, nylon, polyether ether ketone, polysulfone, polyether sulfone, tetrafluoroethylene-erfluoroalkylvinyl ether copolymer, polyvinyl fluoride, tetraflyoroethylene ethylene copolymer, tetrafluoroethylene hexafluoro polymer copolymer, or a combination of any of these.

The term "transparent" means at least around 60% of incident light transmittal at the thickness used in a photovoltaic device and at a wavelength or a range of wavelength used during operation of photovoltaic cells. Preferably, it is over 70%, more preferably, over 75%, the most preferably, it is over 80%.

In some embodiments of the present invention, the array of pixels comprises a $1^{st}$ organic solvent in the range from 0.001 wt. % to 1 wt. % on the basis of total amount of the matrix material and the nanosized light emitting material in the array of pixels.

In some embodiments of the present invention, the optical medium can be an optical film, for example, a color filter, color conversion film, remote phosphor tape, or another film or filter.

Optical Device

In another aspect, the invention further relates to an optical device comprising the optical medium.

In some embodiments of the present invention, the optical device can be a liquid crystal display (LCD), Organic Light Emitting Diode (OLED), backlight unit for display, Light Emitting Diode (LED), Micro Electro Mechanical Systems (here in after "MEMS"), electro wetting display, or an electrophoretic display, or a lighting device.

Fabrication Process

In another aspect, the present invention furthermore relates to method for preparing of the composition according to one or more of claims 1 to 11, wherein the method comprising following step (a), (a) mixing $1^{st}$ organic solvent having a boiling point 150° C. or more, a matrix material, and a nanosized light emitting material, wherein the matrix material is a transparent polymer.

Preferably, step (a) is carried out at a room temperature under inert condition such as under $N_2$ condition.

In another aspect, the present invention also relates to method for preparing of a light emitting medium, wherein the method comprises at least following steps (A) and (B) in this sequence, (A) providing the composition according to one or more of claims 1 to 10, onto a substrate, (B) removing the $1^{st}$ organic solvent from the composition Preferably, all steps are carried out under inert condition such as under $N_2$ condition.

Printing method in step (A) to provide the composition is not particularly limited.

An inkjet printing method, or a nozzle printing method is preferably used. More preferably, an inkjet printing method is used for a pattern printing.

In step (B), in some embodiments of the present invention, a clean oven or a hot plate can be used.

From the view point of preventing or reducing a convection of the composition when the solvent in the composition is drying up from the composition, temperature in step (B) can be set in the range from plus 10° C. to the boiling point of the $1^{st}$ organic solvent to 25° C.

Effect of the Invention

The present invention provides,
1. a novel composition comprising a nanosized light emitting material and a matrix material which provides improved homogeneous light luminescent layer or light luminescent pattern after drying of said composition,
2. a novel composition comprising a nanosized light emitting material and a matrix material which can prevent or reduce phenomena of moving nanosized light emitting material to the edge of printed pattern when printing and drying of said composition, 3. a novel composition comprising a nanosized light emitting material and a matrix material, which enables smooth printing,
4. a novel composition comprising a nanosized light emitting material and a matrix material, which enables better dispersibility of said nanosized light emitting material in said composition, and
5. a simple fabrication process for making light luminescent pattern including matrix material and a nanosized light emitting material.

Definition of Terms

The term "semiconductor" means a material which has electrical conductivity to a degree between that of a conductor (such as copper) and that of an insulator (such as glass) at room temperature.

The term "inorganic" means any material not containing carbon atoms or any compound that containing carbon atoms ionically bound to other atoms such as carbon monoxide, carbon dioxide, carbonates, cyanides, cyanates, carbides, and thiocyanates.

The term "emission" means the emission of electromagnetic waves by electron transitions in atoms and molecules.

The working examples 1-3 below provide descriptions of the present invention, as well as an in detail description of their fabrication.

WORKING EXAMPLES

Working Example 1: Preparation of Composition 0.2 g of trioctylphosphine oxide (hereafter TOPO) covered elongated shaped quantum sized material for red emission (from Merck) are dispersed in 5 g of mesitylene (from Sigma Aldrich) by ultrasonication using Branson chip sonicator (solution A).

0.2 g of cycloolefine polymer (hereafter COP) having 60,000 molecular weight is dissolved in tetradecane by a stirrer at 80° C. (solution B).

Then, solution A and B are combined and mixed by stirrer at 25° C. for 10 minutes.

Finally, composition 1 is obtained.

Working Example 2: Preparation of Composition 0.2 g of trioctylphosphine oxide (hereafter TOPO) covered spherical shaped quantum sized material for red emission (from Merck) are dispersed in 5 g of mesitylene (from Sigma Aldrich) by ultra-sonication using Branson chip sonicator (solution C).

0.2 g of cycloolefine polymer (hereafter COP) having 60,000 molecular weight is dissolved in tetradecane by a stirrer at 80° C. (solution D).

Then, solution C and D are combined and mixed by stirrer at 25° C. for 10 minutes.

Finally, composition 2 is obtained.

Comparative Example 1: Preparation of Light Luminescent Particles 0.2 g of trioctylphosphine oxide (hereafter TOPO) covered spherical shaped quantum sized material for red emission (from Merck) are dispersed in 5 g of mesitylene (from Sigma Aldrich) by ultra-sonication using Branson chip sonicator. Finally, composition 3 is obtained.

Working Example 3: Printing Test

The obtained composition 1 is printed onto a glass substrate using an ink jet printing machine manufactured by Fujifilm Diimatix (DMP-2831).

The drops of the composition 1 are put on the substrate sequentially with 100 μm distance and dried at room temperature in air condition. The printed drops have 50 μm of average diameter.

Figure 1:
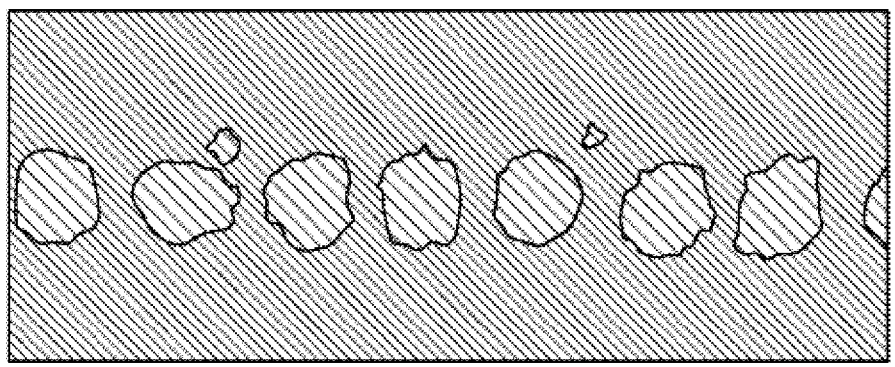
FIG. 1: shows the dried pattern of printed composition 1.

FIG. 1 shows the dried pattern of printed composition 1. The pattern shows an even distribution of particles in the printing area across the drop diameter. The photo is taken under Ultraviolet light.

Comparative Example 2: Printing Test

The composition 3 from comparative example 1 is printed onto a glass substrate using an ink jet printing machine manufactured by Fujifilm Diimatix (DMP-2831).

The drops of the composition 1 are put on the substrate sequentially with 100 μm distance and dried at room temperature in air condition. The printed drops have 50 μm of average diameter.

FIG. 2 shows the dried pattern of printed composition 3. The pattern shows an uneven distribution of particles in the printing area caused by phenomena of moving nanosized light emitting material to the edge of printed pattern. The majority of the luminescent particles of the ink is deposited at the edge of the drops. The photo is taken under Ultraviolet light.

Table 1 show the summary of the printing test results.

TABLE 1

| Sample name | Printing test results |
| --- | --- |
| Composition 1 | distribution of particles in the printing area |
| Composition 3 | uneven distribution of particles in the printing area |

The invention claimed is:
1. A composition comprising:
a $1^{st}$ organic solvent selected from the group consisting of: alkyl chain compounds having 9-25 carbon atoms; alkenyl chain compounds having 10-25 carbon atoms; glycerin; dimethyl sulfoxide; trimethyl benzenes; docecylbenzene; cyclohexylbenzene; 1,2,3,4-tetramethylbenzene; 1,2,3,5-tetramethylbenzene; 3-isopropylbiphenyl; 3-methylbiphenyl; 4-methylbiphenyl; p-1-methylnaphthalene; and 1,2,3,4-tetrahydronaphthalene;
a $2^{nd}$ organic solvent having a boiling point in a range from 150° C. to 330° C. and being different from the $1^{st}$ organic solvent;
a matrix material;
and a nanosized light emitting material;
wherein the matrix material comprises a polymer selected from the group consisting of cyclo-olefin copolymers and ethylene vinyl alcohols.
2. The composition according to claim 1, wherein the composition has an absolute viscosity in the range from 1 mPa·s to 20 mPa·s.
3. The composition according to claim 1, wherein the composition has a liquid surface tension in a range from 10 mN/m to 60 mN/m.

4. The composition according to claim 1, wherein the polymer has a molecular weight in a range from 10,000-150,000.

5. The composition according to claim 1, wherein the polymer is a cyclo-olefin copolymer.

6. The composition according to claim 1, wherein the $1^{st}$ organic solvent is an alkyl chain compound with an alkyl chain having 10 to 25 carbon atoms or an alkenyl chain compound with an alkenyl chain having 11 to 25 carbon atoms.

7. The composition according to claim 1, wherein the $2^{nd}$ organic solvent is selected from the group consisting of hydrocarbons having 5-25 carbon atoms, glycols, acetamides, and dimethyl sulfoxide.

8. Method for preparing of the composition according to claim 1, wherein the method comprises following step (a),
   (a) mixing the $1^{st}$ organic solvent, the $2^{nd}$ organic solvent, the matrix material, and the nanosized light emitting material.

9. Method for preparing of a light emitting medium, wherein the method comprises at least following steps (A) and (B) in this sequence,
   (A) providing the composition according to claim 1, onto a substrate,
   (B) removing the $1^{st}$ organic solvent from the composition.

10. The composition according to claim 1, wherein the polymer is a transparent polymer.

11. The method of claim 9, wherein the substrate is a transparent substrate including an array of pixels which are filled with the matrix material and the nanosized light emitting material by the method.

12. The method of claim 11, further comprising preparing a light emitting device from the light emitting medium prepared by the method.

* * * * *